United States Patent
Ueno et al.

(10) Patent No.: US 7,850,800 B2
(45) Date of Patent: Dec. 14, 2010

(54) BONDING SHEET APPLYING APPARATUS AND METHOD

(75) Inventors: Tetsuro Ueno, Osaka (JP); Toshihiko Tsujikawa, Osaka (JP)

(73) Assignee: Panasonic Corporation, Osaka (JP)

( * ) Notice: Subject to any disclaimer, the term of this patent is extended or adjusted under 35 U.S.C. 154(b) by 598 days.

(21) Appl. No.: 11/911,164

(22) PCT Filed: Nov. 14, 2006

(86) PCT No.: PCT/JP2006/322620

§ 371 (c)(1),
(2), (4) Date: Oct. 10, 2007

(87) PCT Pub. No.: WO2007/060855

PCT Pub. Date: May 31, 2007

(65) Prior Publication Data

US 2009/0065120 A1 Mar. 12, 2009

(30) Foreign Application Priority Data

Nov. 22, 2005 (JP) ............................. 2005-336815

(51) Int. Cl.
*B32B 41/00* (2006.01)
(52) U.S. Cl. .................... 156/64; 156/358; 156/360; 156/378; 156/379
(58) Field of Classification Search .................. 156/64, 156/358, 360, 378, 379
See application file for complete search history.

(56) References Cited

U.S. PATENT DOCUMENTS

| 5,403,412 | A | * | 4/1995 | Hidaka et al. | 156/64 |
| 6,869,491 | B2 | * | 3/2005 | Onitsuka | 156/64 |
| 2004/0261947 | A1 | * | 12/2004 | Haraguchi | 156/351 |

FOREIGN PATENT DOCUMENTS

| JP | 09-006251 | 1/1997 |
| JP | 10-027820 | 1/1998 |
| JP | 3324599 | 9/2002 |

OTHER PUBLICATIONS

Machine translation of JP 09-006251 (filed in IDS by applicant). Original document published Jan. 1997, Japan.*

(Continued)

*Primary Examiner*—George R Koch, III
(74) *Attorney, Agent, or Firm*—Wenderoth, Lind & Ponack, L.L.P.

(57) ABSTRACT

A bonding sheet applying apparatus of the present invention includes an applying stage for supporting a board, an applying unit having a bonding-sheet supplying device for supplying a bonding sheet to above the board supported by the applying stage and an applying head provided above the board so as to be movable up and down, for sequentially pressing the bonding sheet supplied by the bonding-sheet supplying device on a plurality of applying positions arranged on the board, a transfer device for transferring the applying unit, which has completed a bonding sheet applying operation for one of the applying positions, to a position upward above another applying position at which a bonding sheet applying operation has not been completed, and an inspection device for inspecting an applied state of the bonding sheet which has already been applied by the applying unit, while the applying unit is successively performing the bonding sheet applying operations.

4 Claims, 11 Drawing Sheets

OTHER PUBLICATIONS

International Search Report issued Dec. 12, 2006 in the International (PCT) Application of which the present application is the U.S. National Stage.

Patent Cooperation Treaty (PCT) International Preliminary Report on Patentability, issued May 27, 2008.

* cited by examiner

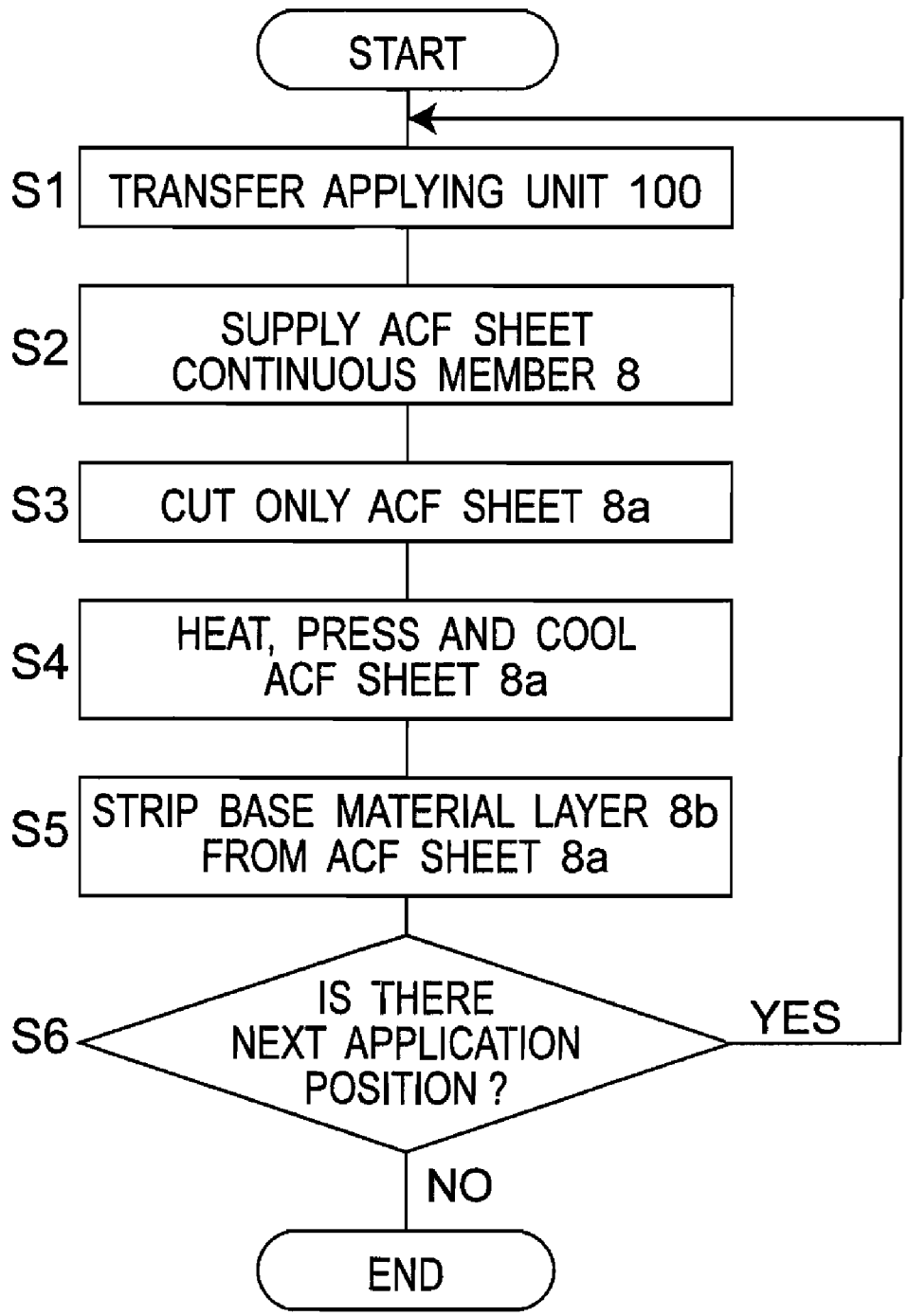

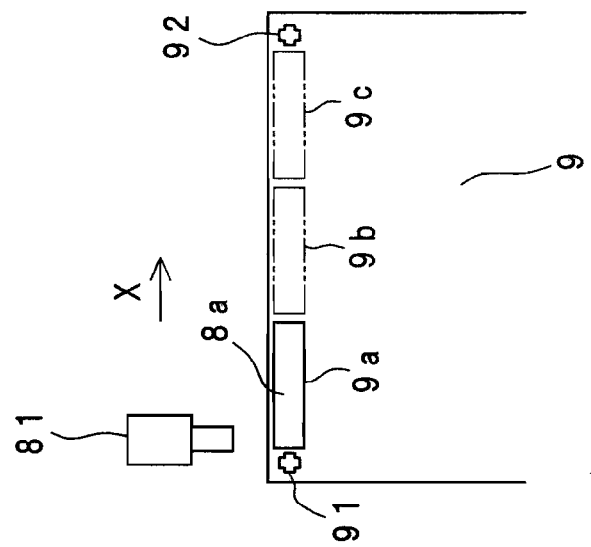
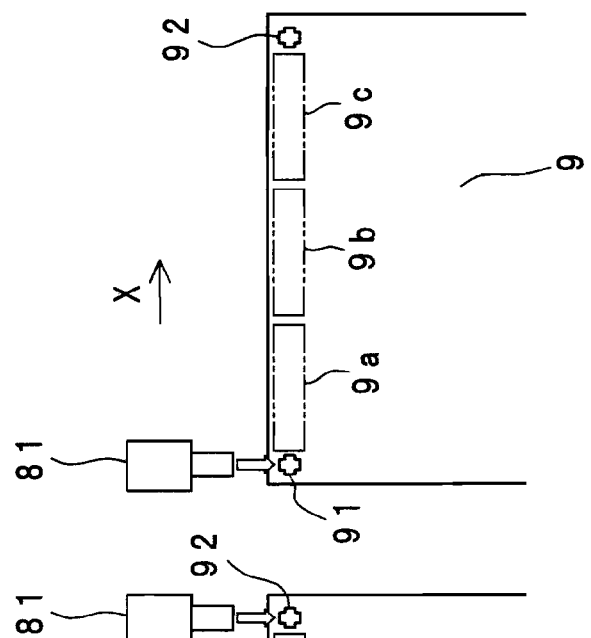
Fig.9A  Fig.9B  Fig.9C

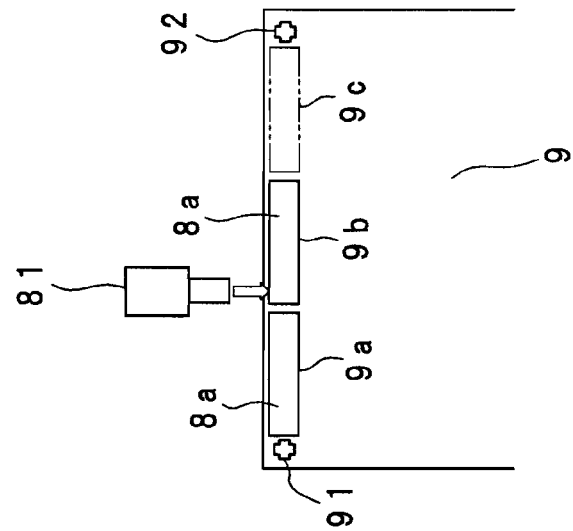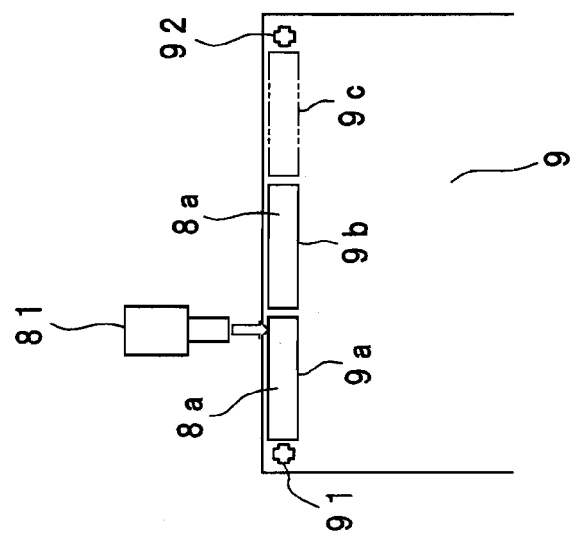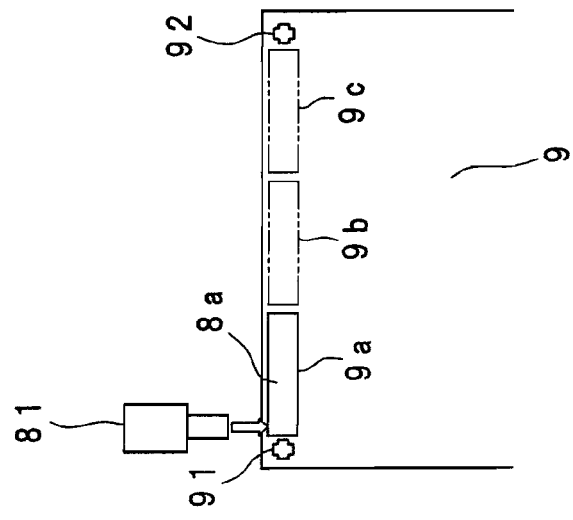

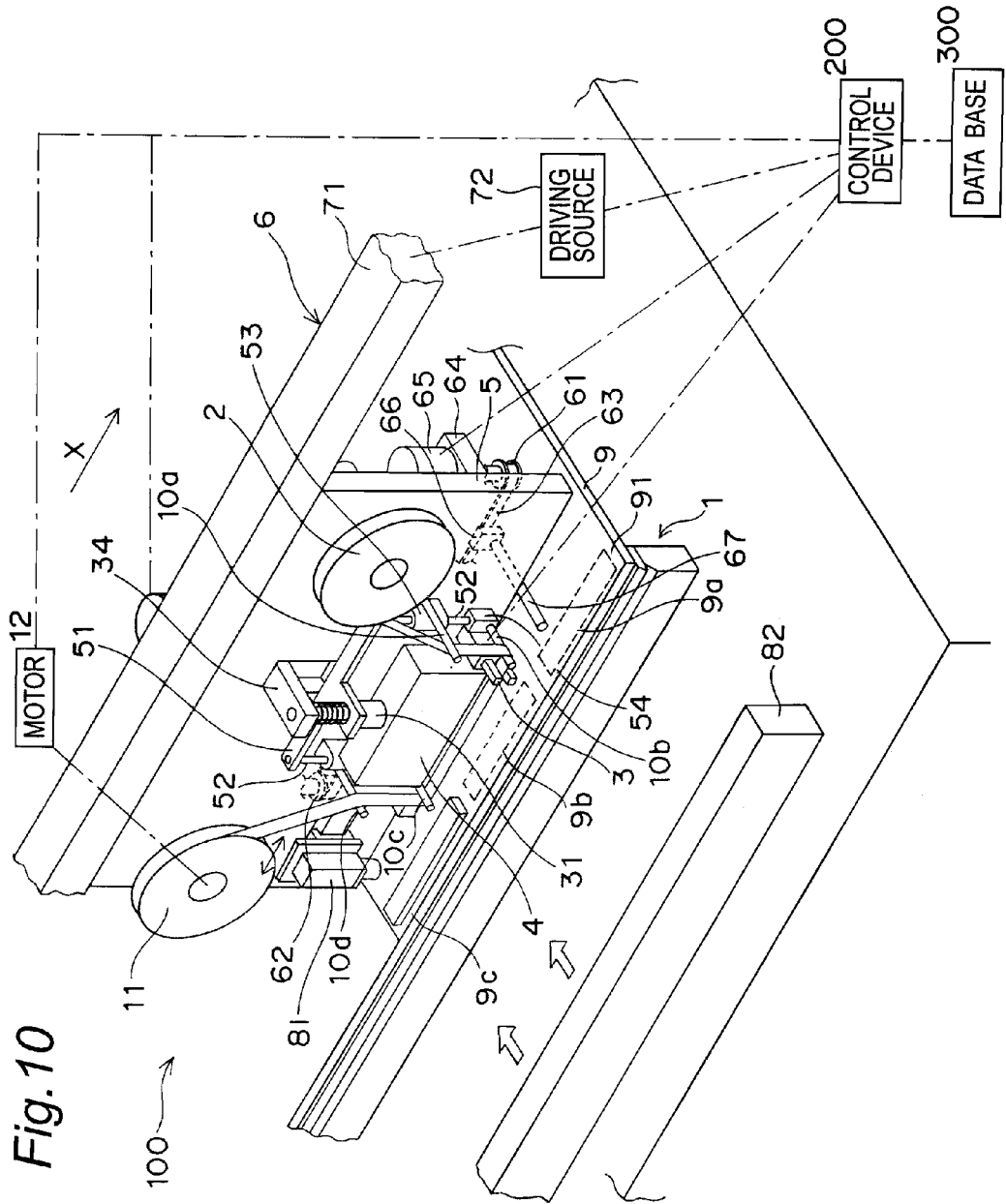

BONDING SHEET APPLYING APPARATUS AND METHOD

This application is a national stage entry of PCT/JP2006/322620, filed Nov. 14, 2006.

TECHNICAL FIELD

The present invention relates to bonding sheets applying apparatus and method for applying bonding sheets to predetermined applying positions on a board.

BACKGROUND ART

Conventionally, bonding sheets have been used for bonding boards including flexible printed circuit (FPC) boards and components such as electronic components, mechanical components and optical components to other components such as liquid crystal display (LCD) board or plasma display panel (PDP) board. For example, anisotropic conductive film sheets (hereinafter, referred to as ACF sheets) have been used for mounting FPC boards on LCD board.

An ACF sheet is formed by including an epoxide-based synthetic resin containing conductive metal particles mixed therein and is capable of bonding two members. An FPC board can be mounted on an LCD board using an ACF sheet through the following three processes, in general. In a first process, the ACF sheet is supplied to a predetermined applying position on a side of the LCD board at a state where a base material layer is adhered to the upper surface of the ACF sheet with the bonding force (adhesive force) of the ACF sheet itself. Subsequently, the ACF sheet is applied at its lower surface to the applying position and the base material layer on the upper surface of the ACF sheet is stripped. In a second process, the FPC board is aligned to the LCD board and then is temporarily pressed and adhered to the ACF sheet on the LCD board. In a third process, the FPC board is completely pressed and applied to the LCD board.

However, the first process has had the issue of the tendency to induce application failures and stripping failures around the positions at which the stripping was started and ended, after the application of the ACF sheet to the applying position and the stripping of the base material layer from the ACF sheet. Further, in recent years, boards such as LCD board and PDP board have tended to be increased in sizet hereof. Along therewith, ACF sheets have been applied to only mounting positions after being divided into points, in order to eliminate the waste of the ACF sheets. Accordingly, ACF sheets have been applied to a single board at a greater number of positions thereon, which has increased the number of positions at which inspections should be performed for determining whether the applied state of ACF sheets is favorable or unfavorable. For example, in mounting components on a board with a size of 37 inches, the number of components to be mounted along a single side of the board is about 3 to 12, which requires performing inspections at least at 14 or more positions on the single board. Accordingly, if an operator performs visual inspections for determining whether the applied state is favorable or unfavorable as in the conventional art, this will require large time and manpower for the inspections.

Japanese Patent Publication No. 3324599 (Patent Document 1) discloses an apparatus and a method for improving the issue. The apparatus and the method of the Patent Document 1 employ an recognition means including a camera for automating inspections of the applied state of a conductive film (ACF sheet) adhered to a display panel such as an LCD, to enable the inspections with accuracy in a short time. More specifically, the following operations are conducted.

First, a plurality of ACF sheets having a base material layer adhered thereon are applied to a single board. Thereafter, only the base material layers are stripped from a plurality of the ACF sheets. Then, the applied state of the plurality of the ACF sheets applied to the single board is inspected, using the recognition means including the camera. If the inspection reveals an application failure or stripping failure even at only a single position, an applying operation or a stripping operation is conducted again at the position of the application failure or stripping failure, and then, an inspection is conducted again. The operation is repeated a predetermined number of times, in order to eliminate application failures or stripping failures in the ACF sheet.

SUMMARY OF THE INVENTION

Issue to be improved by the Invention However, the apparatus and method of the patent Document 1 inspect the applied state of a plurality of ACF sheets applied to a single board one by one in order, until the inspection of the applied state of all the ACF sheets on the board has been completed. Accordingly, there has been the issue that, as the number of positions on the single board to which ACF sheets should be applied is increased or as the number of re-inspections is increased due to the occurrence of application failures or stripping failures, along with the increase of the size of the board, the time period from the start of application of ACF sheets to the completion of inspections is progressively increased.

Further, since the apparatus and method of the patent Document 1 perform inspections after the application of all a plurality of the ACF sheets to the board, there is the possibility of significant waste of ACF sheets, and also, there is the possibility of significant waste of ACF sheet applying operations, in the event of the occurrence of many application failures which require re-applications.

Therefore, it is an object of the present invention to provide a bonding-sheet applying apparatus and method capable of largely reducing the time period from the start of application of bonding sheets to a single board to the completion of inspections and also capable of reducing the possibility of losses of bonding sheets and losses of applying operations.

Means for Improving the Issues

In order to achieve the above object, the present invention has the following constitution.

According to a first aspect of the present invention, there is provided a bonding-sheet applying apparatus comprising:

an applying stage for supporting a board;

an applying unit having a bonding-sheet supplying device for supplying a bonding sheet to above the board supported by the applying stage, and an applying head provided above the board so as to be movable up and down, for sequentially pressing the bonding sheet supplied by the bonding-sheet supplying device on a plurality of applying positions arranged on the board;

a transfer device for transferring the applying unit which has completed the bonding sheet applying operation for one of the applying positions, to a position upward above another applying position at which a bonding sheet applying operation has not been completed; and an inspection device for inspecting an applied state of the bonding sheet which has already been applied by the applying unit, while the applying unit is successively performing the bonding sheet applying operations.

According to a second aspect of the present invention, there is provided the bonding-sheet applying apparatus as defined in the first aspect, wherein the transfer device transfers the inspection device and the applying unit integrally.

According to a third aspect of the present invention, there is provided the bonding-sheet applying apparatus as defined in the first aspect, further comprising an inspection-device transfer device for transferring the inspection device independently of the applying unit According to a fourth aspect of the present invention, there is provided the bonding-sheet applying apparatus as defined in any one of the first to third aspects, wherein the applying stage is adapted to support the a plurality of applying positions of the board below and being includes a light transparent member which transmits light and a light diffusion member which diffuses light, placed on a portion near an entire portion or a portion for supporting the a plurality of applying positions of the board, the bonding-sheet applying apparatus further has a light source which directs its light to the inside of the light transparent member, and the inspection device inspects the applied state of the bonding sheet, at a state where the light from the light source which has passed through the light transparent member, diffused by the light diffusion member and passed through the board is lighted to a bonding sheet which has already been applied to the applying position by the applying unit.

According to a fifth aspect of the present invention, there is provided the bonding-sheet applying apparatus as defined in the fourth aspect, further comprising a light reflection member which reflects the light from the light source to direct the light to the inside of the light transparent member.

According to a sixth aspect of the present invention, there is provided the bonding-sheet applying method comprising, applying a first bonding sheet to a first applying position placed on a board, by an applying unit for applying bonding sheets to the board by descending an applying head;

transferring the applying unit which has applied the first bonding sheet, to above a second applying position placed on the board;

applying a second bonding sheet to the second applying position by the applying unit transferred to above the second applying position; and inspecting the applied state of the first bonding sheet, during the time interval from the start of the transferring of the applying unit to above the second applying position to the completion of the operation for applying the second bonding sheet to the second applying position.

According to a seventh aspect of the present invention, there is provided the bonding-sheet applying method as defined in the sixth aspect, wherein in inspecting the applied state of the first bonding sheet, diffused light is directed to the first applying position below and then is passed through the board for directing the diffused light to the first bonding sheet, and the state of the interception of the diffused light by the first bonding sheet is inspected for inspecting the applied state of the first bonding sheet.

EFFECTS OF THE INVENTION

According to the present invention, the inspections of the applied state are performed on bonding sheets which have already been applied by the applying unit, while the applying unit performs operations for applying bonding sheets successively. This can increase the efficiency of application and inspection operations, thereby largely reducing the time period from the start of application of bonding sheets to a single board to the completion of inspections. Furthermore, in the event of the occurrence of an application failure or stripping failure, it is possible to stop the subsequent applying operation, which can reduce the loss of bonding sheets (to only a single bonding sheet) and the loss of the applying operations, in comparison with the conventional art.

Further, although, in the apparatus and method of the patent Document 1, a light source is placed in the same direction as the camera with respect to the board (thereabove), it is preferable to direct light to the board below, in view of the viewability. As means for realizing this method, there is possibly a method of incorporating a light source within a stage for supporting the board at ACF-sheet applying positions or a method of placing a light source at a state where it is retracted from the stage and also retracting the board such that it is positioned above the light source. However, heat is transferred to the stage during application of ACF sheets, which makes it difficult to incorporate a light source therein. Furthermore, there is the issue that, if the camera directly receives the light emitted from the light source, this tends to cause light unevenness due to the reflection of the light source. Further, if the board is frequently moved, this will increase the possibility of damages of the board, which is no preferable.

In particular, according to the fourth aspect of the present invention, near the entire portion of the applying stage or the portion thereof for supporting the board, there are provided a light transparent member which transmits light and a light diffusion member which diffuses light, such that light enters the inside of the light transparent member. This enables directing the light to the board below and photographing using the transmitted light, thereby improving the viewability of the end portions of ACF sheets. This also suppresses the light unevenness caused by the reflection of the light source, since the light diffusion member diffuses light. Further, this prevents the board from being damaged, since inspections can be performed without moving the board.

On the other hand, it has been generally considered that, as a light source for use in bonding ACF sheets, a blue LED is suitable and preferable. However, there has been the following issue. That is, in the case of using a light source with smaller illumination such as a blue LED, it is necessary to place it near a light transparent member. If the light source is placed near the light transparent member, this will tend to cause light unevenness.

Further, according to the fourth aspect of the present invention, the light diffusion member is used to suppress the occurrence of the light unevenness, which enables use of a light source with smaller illumination such as a blue LED as the light source.

Furthermore, according to the fifth embodiment of the present invention, the light from the light source is incident on the light transparent member after being reflected by the light reflection member, which can further suppress the light unevenness, thus improving the inspection accuracy. Further, this can increase the degree of flexibility of the position at which the light source is installed.

BRIEF DESCRIPTION OF THE DRAWINGS

These and other aspects and features of the present invention will become clear from the following description taken in conjunction with the preferred embodiments thereof with reference to the accompanying drawings, in which:

FIG. 7 is a flow chart of applying step by the bonding-sheet applying apparatus according to the present embodiment.

FIG. 9A is an explanation view of the inspection step by the bonding-sheet applying apparatus according to the present embodiment.

FIG. 9B is an explanation view of the inspection step by the bonding-sheet applying apparatus according to the present embodiment.

FIG. 9C is an explanation view of the inspection step by the bonding-sheet applying apparatus according to the present embodiment.

FIG. 9D is an explanation view of the inspection step by the bonding-sheet applying apparatus according to the present embodiment.

FIG. 9E is an explanation view of the inspection step by the bonding-sheet applying apparatus according to the present embodiment.

FIG. 9F is an explanation view of the inspection step by the bonding-sheet applying apparatus according to the present embodiment.

FIG. 10 is a perspective view illustrating another bonding-sheet applying apparatus according to the present embodiment.

DETAILED DESCRIPTION OF THE INVENTION

Figure 1:
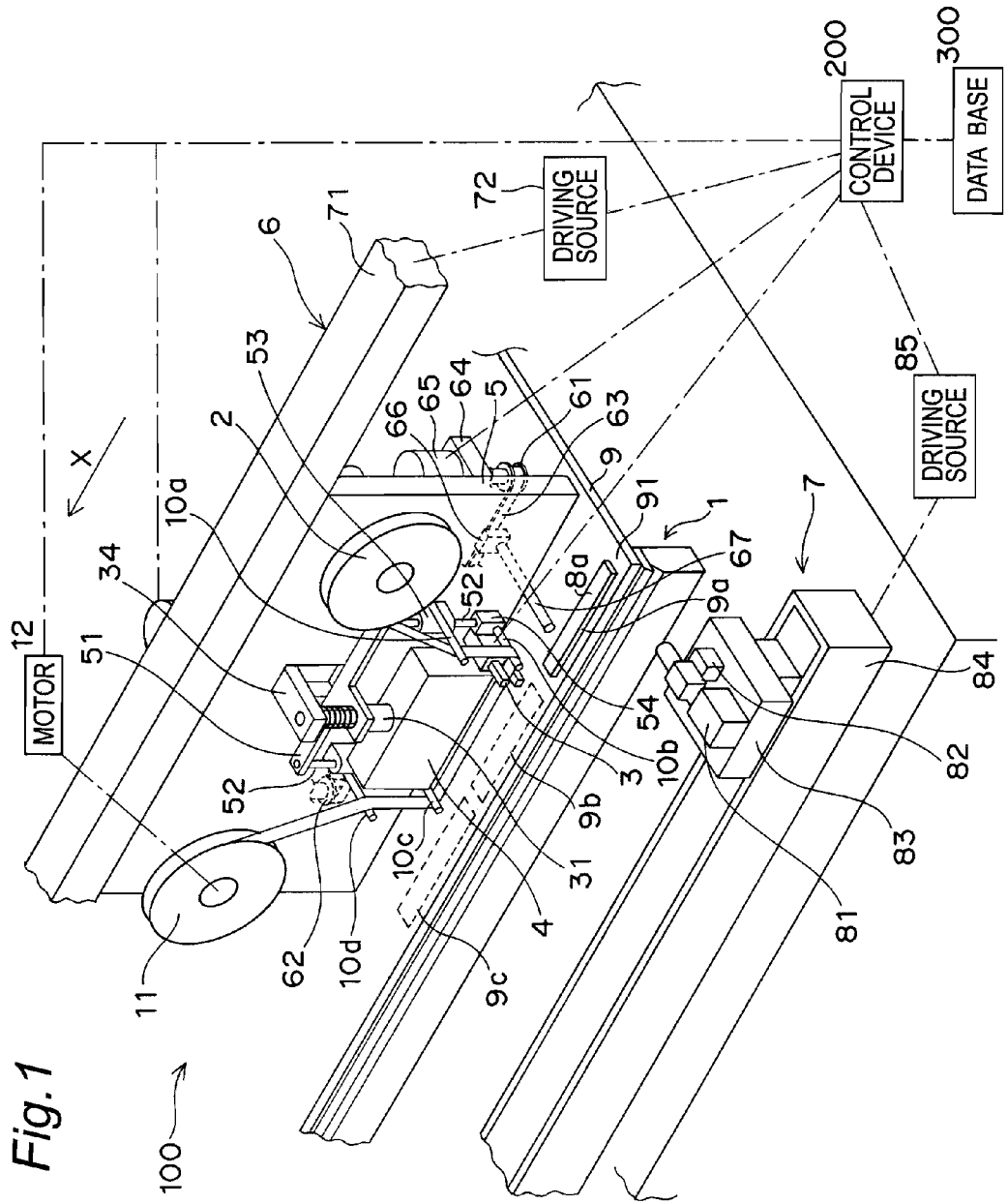
FIG. 1 is a perspective view illustrating a bonding-sheet applying apparatus according to an embodiment of the present invention.

Before the description of the present invention proceeds, it is to be noted that like components are designated by like reference numerals throughout the accompanying drawings.

Referring to Figures, the following description will discuss embodiment in accordance with the present invention in detail.

Figure 2:
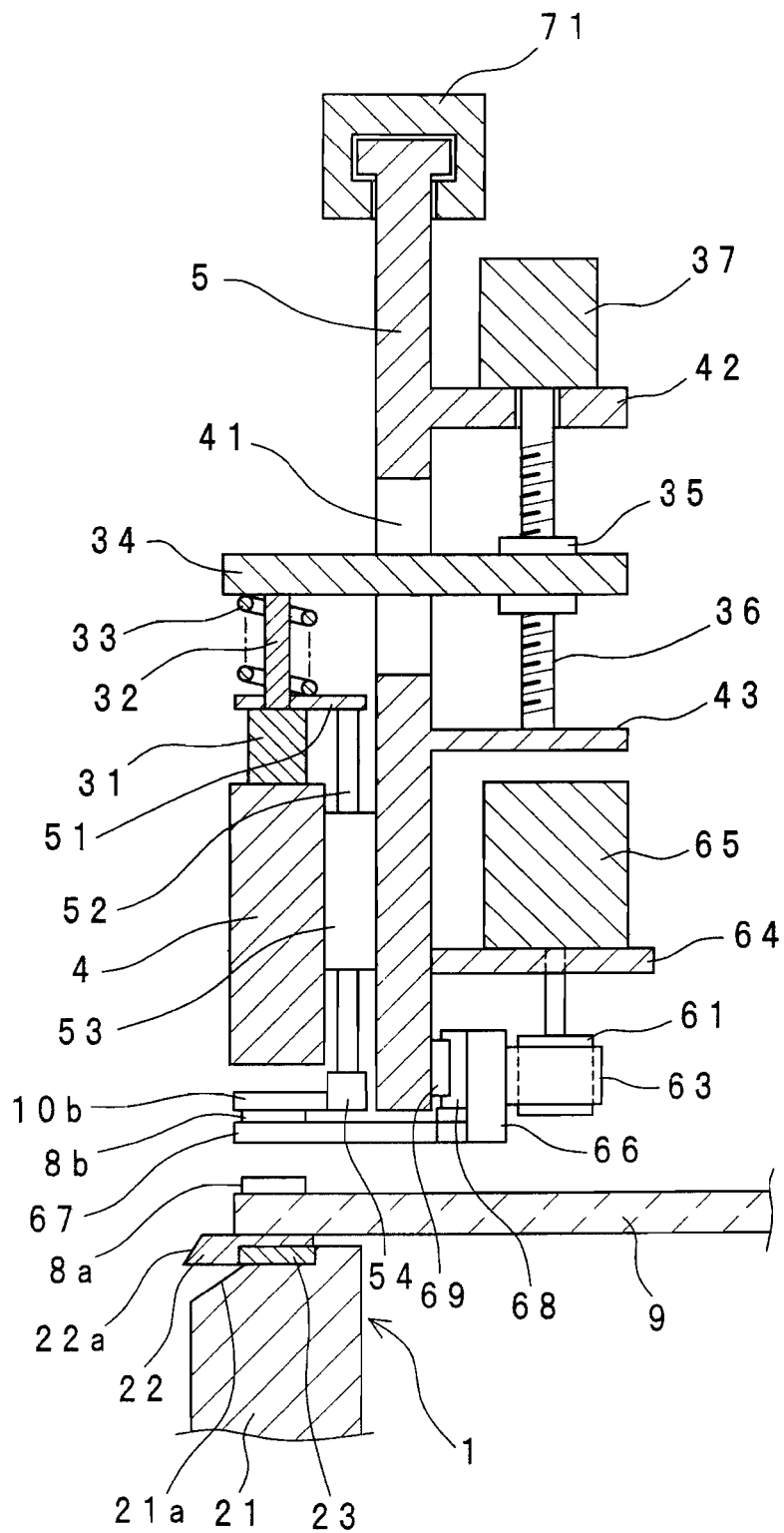
FIG. 2 is a cross-sectional view of the bonding-sheet applying apparatus according to the present embodiment.

FIG. 1 is a perspective view illustrating a bonding-sheet applying apparatus according to an embodiment of the present invention. FIG. 2 is an enlarged cross-sectional view of a portion thereof. In the present embodiment, the bonding-sheet applying apparatus is used for applying an ACF sheet 8a as an exemplary bonding sheet to an LCD board 9 as an exemplary board.

In FIG. 1, the bonding-sheet applying apparatus according to the present embodiment includes an applying stage 1 for supporting a single side of the rectangular LCD board 9, an applying unit 100 which is placed to be faced with the applying stage 1 thereabove, for successively applying an ACF sheet 8a to a plurality of applying positions 9a to 9c arranged along a single line along the single side of the LCD board 9, a transfer device 6 for transferring the applying unit 100 forwardly and rearwardly in the direction X of application along the single side of the LCD board 9, and an inspection device 7 which is placed at a side of the applying stage 1 (at the front side in FIG. 1) in parallel to the single side of the LCD board 9, for inspecting the applied state of the ACF sheet 8a which has been applied by the applying unit 100.

The applying stage 1 has a flat supporting surface having a long rectangular shape and is adapted to support the lower surface of the LCD board 9 at the single side with the flat supporting surface below. The portion supported by the flat supporting surface of the applying stage 1 includes a plurality of the applying positions 9a to 9c along the single side of the LCD board 9. That is, the width of the flat supporting surface of the applying stage 1, namely the width of the surface of the applying stage 1 which comes into contact with the LCD board 9 in a direction orthogonal to the direction X of application (lateral direction), is set to be greater than the width of the ACF sheet 8a. The applying positions 9a to 9c are placed in serial between a positioning mark 91 and a positioning mark 92 (see FIGS. 9A to 9I) provided at the opposite end portions of the single side of the LCD board 9. The structure of the applying stage 1 will be described in detail later.

The applying unit 100 includes a supply reel 2, a cutting device 3, an applying head 4, a frame 5, guide pins 10a to 10d, a winding-up reel 11 and a motor 12.

As illustrated in FIG. 1, the supply reel 2 is rotatably supported through a shaft at a right upper portion of the surface of the rectangular frame 5 which is faced to the inspection device 7 (hereinafter, referred to as a front surface) in FIG. 1. The supply reel 2 includes an ACF sheet continuous member 8 which is wound (see FIG. 3) as an exemplary bonding sheet continuous member, such that ACF sheet 8a is supplied to above the applying stage 1 but below the applying head 4 while being faced to the LCD board 9. The supply reel 2 incorporates a torsion spring for applying a certain torque to the ACF sheet continuous member 8 in the direction of winding-back, in order to prevent the ACF sheet continuous member 8 from being excessively wound back to be loosened undesirably during movement.

Figure 3:
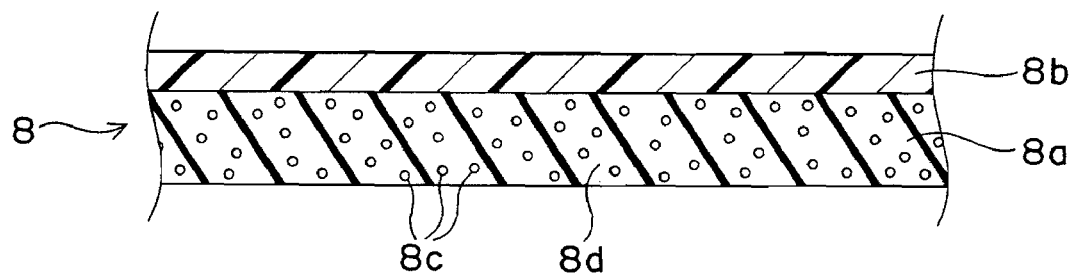
FIG. 3 is a partial enlarged cross-sectional view illustrating an ACF sheet according to the present embodiment.

As illustrated in FIG. 3, the ACF sheet continuous member 8 is constituted by the ACF sheet 8a formed by including an insulation epoxide-based synthetic resin layer 8d containing many conductive particles 8c dispersed therein, and a base material layer 8b adhered to the upper surface of the ACF sheet 8a through the bonding force (the adhesive force) of the ACF sheet 8a itself. The ACF sheet 8a has the property of being softened when heated and being cured when cooled. The ACF sheet 8a is capable of bonding two members using this property. After being heated and then cooled, the ACF sheet 8a has a bonding force greater than the bonding force between the ACF sheet 8a and the base material layer 8b.

The applying head 4 has a rectangular-parallelepiped plate shape and is provided at a location below the center of the front surface of the frame 5 in FIG. 1 and above the applying stage 1, such that it is movable upwardly and downwardly between an upper end position and a lower end position relative to the frame 5 in the location. When the applying head 4 is positioned at the upper end position, the ACF sheet 8a of the ACF sheet continuous member 8 is placed to be extended under the flat bottom surface of the applying head 4, by being guided by lower movable guide pins 10b and 10c, having a predetermined interval. On the other hand, when the applying head 4 is positioned at the lower end position, the applying head 4 is placed such that the ACF sheet 8a of the ACF sheet continuous member 8 which has been extended by being guided by the lower movable guide pins 10b and 10c can be further descended toward the LCD board 9 by the flat bottom surface of the applying head 4 and then the ACF sheet 8a can be pressed and applied to the LCD board 9 by the flat bottom surface of the applying head 4. The width and the length of the flat bottom surface of the applying head 4 are set to be slightly greater than the width and the length of the applying positions 9a to 9c, respectively. The applying head 4 incorporates a heater (not illustrated) and a cooling device (not illustrated). The applying head 4 is heated to about 80 to 120° C. at its flat bottom surface by the heater, when it is successively descended to the applying positions 9a to 9c. The applying head 4 is capable of pressing the ACF sheet 8a to the applying positions 9a to 9c with its flat bottom surface being heated, with the base material layer 8b interposed therebetween. Subsequently, the applying head 4 stops the heating by the heater and then cools the ACF sheet 8a with the cooling device with the base material layer 8b interposed therebetween. Thus, the ACF sheet 8a is applied to the applying positions 9a to 9c.

The ACF sheet continuous member 8 which has been drawn from the supply reel 2 is guided by an upper fixed guide pin 10a protruded from the frame 5 between the supply reel 2 and the vicinity of the upper portion of the applying head 4 and by a lower movable guide pin 10b placed under the upper fixed guide pin 10a, as will be described later, such that it can travel under the bottom surface of the applying head 4.

At the side of the applying head 4 which is opposite from the supply reel 2, namely at the left side of the front surface of the frame 5, the winding-up reel 11 is rotatably supported through a shaft for winding up the base material layer 8b after the ACF sheet 8a is stripped from the ACF sheet continuous member 8. Further, the base material layer 8b which has been transferred under the bottom surface of the applying head 4 are wound up by the winding-up reel 11, by being guided thereto by an upper fixed guide pin 10c protruded from the frame 5 between the winding-up reel 11 and the vicinity of the upper portion of the applying head 4 and by a lower movable guide pin 10c placed under the upper fixed guide pin 10d as will be described later. The motor 12 for rotating the winding-up reel 11 in such a direction as to wind up the base material layer 8b is connected to the winding-up reel 11.

At the center portion of the upper surface of the applying head 4, there is protruded a cylindrical protrusion 31, as illustrated in FIG. 1 and FIG. 2. On the protrusion 31, a cylindrical rod 32 having a smaller diameter than that of the protrusion 31 is erected. A coil spring 33 is mounted around the outer periphery of the rod 32. The rod 32 is coupled at its upper end portion to a rectangular-shaped bar 34 extending in the lateral direction (in the direction orthogonal to the direction X of application). The bar 34 is penetrated through an opening portion 41 formed at the center portion of the frame 5 such that it is movable upwardly and downwardly. A nut 35 is fixed to the rear end portion of the bar 34. This nut 35 is threadably mounted to a ball screw 36 which is erected rotatably about a vertical axis, between the lower surface of a supporting plate 42 protruded from the back surface of the frame 5 and the upper surface of a supporting plate 43 protruded from the back surface of the frame 5 vertically below the supporting plate 42. A motor 37 for rotating the ball screw 36 is installed on the upper surface of the supporting plate 42. If the motor 37 is driven to rotate the ball screw 36 in the normal direction or in the reverse direction, the nut 35 is moved upwardly and downwardly along the ball screw 36. Accordingly, if the motor 37 drives the ball screw 36 in the normal direction or in the reverse direction, the applying head 4 coupled to the nut 35 is moved upwardly and downwardly, through the bar 34, the rod 32 and the protrusion 31.

Further, between the protrusion 31 and the coil spring 33, a T-shaped arm 51 is placed in parallel to the upper surface of the LCD board 9, as illustrated in FIG. 1 and FIG. 2. The rod 32 is penetrated through the tip end portion of the arm 51 which is farther from the frame 5 such that the rod 32 is movable relative to the arm 51. The coil spring 33 presses the arm 51 against the upper surface of the protrusion 31. Cylindrical rods 52 are coupled to the opposite end portions of the arm 51 such that they extend downwardly. The respective rods 52, 52 are penetrated through guide rings 53, 53 secured to the front surface of the frame 5 such the rods 52, 52 are movable upwardly and downwardly. Retaining blocks 54 are coupled to the lower end portions of the rods 52 and 52. The retaining blocks 54, 54 hold one end portions of the lower movable guide pins 10b and 10c, such that the lower movable pins 10b and 10c extend in parallel to the upper surface of the LCD board 9.

Accordingly, if the motor 37 is driven to rotate the ball screw 36 in the normal direction, this descends the lower movable guide pins 10b and 10c coupled to the nut 35 through the retaining blocks 54, 54, the rods 52, 52, the arm 51, the rod 32 and the bar 34 integrally, at the same speed as the applying head 4. Further, once the retaining blocks 54, 54 which hold the lower movable pins 10b and 10c have come into contact with the upper surface of the LCD board 9, the lower movable pins 10b and 10c are prevented from being descended any more. Therefore only the applying head 4 is descended along with the protrusion 31 and the rod 32 with respect to the lower movable guide pins 10b and 10c along with the further descend of the bar 34 while contracting the coil spring 33, thereby applying an ACF sheet 8a to, for example, an applying position 9a of the LCD board 9. Further, it is preferable that the retaining blocks 54 are made of an elastic material such as a rubber, in order to prevent the LCD board 9 from being damaged thereby. Further, if the motor 37 is driven in the reverse direction to rotate the ball screw 36 in the reverse direction after the application of the ACF sheet 8a, then only the applying head 4 ascends with respect to the lower movable guide pins 10b and 10c to expand the coil spring 33 to the original length at first, and subsequently, the lower movable guide pins 10b and 10c ascend integrally with the applying head 4 at the same speed as the applying head 4. A control device 200 controls the operations for driving the motor 37 in the normal and reverse directions, on the basis of data of operation programs for bonding operations, which has been pre-stored in a data base 300. The data base 300 stores at least data of the positions, the length and the like of a plurality of the applying positions 9a to 9c along at least the single side of the LCD board 9. Further, in cases where ACF sheets 8a are applied along other two or three sides of the LCD board 9, the data base 300 also stores data of the positions, the length and the like of these applying positions.

On the back surface of the frame 5, there is protruded a rectangular-shaped supporting plate 64 having a length greater than the interval between the lower movable guide pins 10b and 10c, in the direction X of application. As illustrated in FIG. 1 and FIG. 2, on the lower surface of the supporting plate 64, at its opposite end portions, a timing pulley 61 or 62 are rotatably placed, and a timing belt 63 is stringed around the timing pulleys 61 and 62. A motor 65 is installed on the upper surface of the supporting plate 64 above the timing pulley 61. The timing pulley 61 is secured to the rotation shaft of the motor 65 which is rotatably penetrated through the supporting plate 64 and, if the motor 65 is driven in the normal and reverse directions, then the timing pulley 61 is rotated in the normal and reverse directions, which causes the timing belt 63 and the timing pulley 62 to rotate in the normal and reverse directions. A rectangular block 66 is secured to a portion of the surface of the timing belt 63 which is faced to the back surface of the frame 5. A pin-shaped moving member 67 is held on a lower portion of the front surface of the block 66. The moving member 67 extends to above the single side of the LCD board 9 near the front surface of the frame 5 under the lower end portion of the frame 5. A slider 68 is mounted to the front surface of the block 66 at it supper portion, as illustrated in FIG. 2. The slider 68 is slidably fitted to a guide rail 69 provided on the back surface of the frame 5 along the direction X of application. Accordingly, if the motor 65 is driven in the normal direction or in the reverse direction to rotate the timing pulley 61 in the normal direction or in the reverse direction, this causes the timing belt 63 and the timing pulley 62 to rotate in the normal direction or in the reverse direction. At this time, the moving member 67, which is integrated with the timing belt 63 through the block 66, is moved forwardly and rearwardly in the direction X of application, along the lower surfaces of the base material layers 8b of the ACF sheet continuous member 8 extended between the lower movable guide pins 10b and 10c. The moving member 67 is operated as described above, and therefore is capable of forcibly stripping the base material layer 8 from the ACF sheet 8a applied to the LCD board 9. The control device 200 controls the operations for driving the motor 65 in the normal and reverse directions, on the basis of the data stored in the data base 300.

Figure 4:
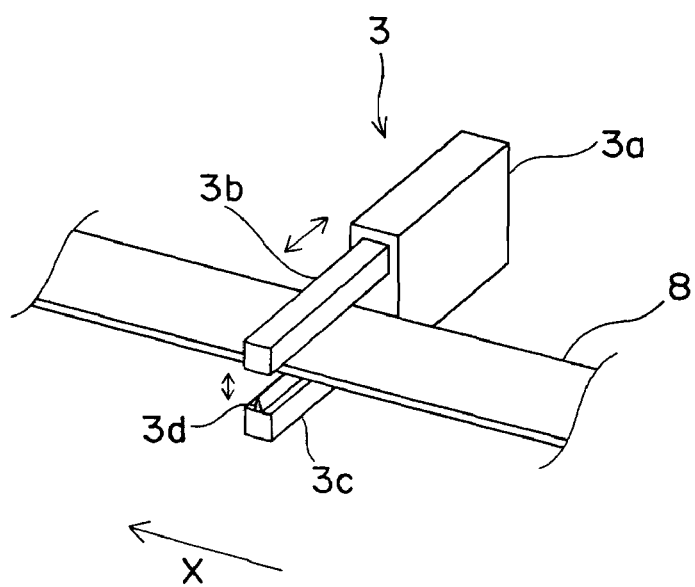
FIG. 4 is a partial enlarged cross-sectional view illustrating a cutting device in the bonding-sheet applying apparatus according to the present embodiment.

As illustrated in FIG. 1, the cutting device 3 is placed on the front surface of the frame 5, on the path of the movement of the ACF sheet continuous member 8, between a side portion of the lower portion of the applying head 4 and the lower movable guide pin 10b. As illustrated in FIG. 4, the cutting device 3 includes a main portion 3a, and an upper arm 3b and a lower arm 3c which are placed to face to each other in the vertical direction such that the upper arm 3b and the lower arm 3c can sandwich the ACF sheet continuous member 8 and are mounted to the main portion 3a at their base end portions. The upper arm 3b and the lower arm 3c are mounted such that they can be expanded and contracted laterally by being driven by a first air cylinder (not illustrated), so that the upper arm 3b and the lower arm 3c are housed within the main portion 3a at a state where they are contracted, and sandwich the ACF sheet continuous member 8 therebetween at a state where they are expanded. Further, the lower arm 3c includes a blade 3d which can be moved upwardly and downwardly by being driven by a second air cylinder (not illustrated).

The cutting device 3 expands the upper arm 3b and the lower arm 3c in the lateral direction by driving them through the first air cylinder to sandwich therebetween, the ACF sheet continuous member 8 which has been drawn from the supply reel 2 and supplied to above the applying stage 1 but below the applying head 4 by the motor 12. Subsequently, the cutting device 3 moves upwardly the blade 3d thereof until the tip of the blade 3d comes into contact with the base material layer 8b by driving it through the second air cylinder. Thus, the cutting device 3 cuts only the ACF sheet 8a of the ACF sheet continuous member 8 into a length equal to the length of the applying position (for example, 9a) to form a cutout, without cutting the base material layer 8b. The control device 200 controls the operations of the cutting device 3 for forming cutouts with the first and second air cylinders, on the basis of the data stored in the data base 300.

If the motor 12 for rotating the winding-up reel 11 is driven to rotate the winding-up reel 11 in the direction of winding-up under the control of the control device 200, this causes the ACF sheet continuous member 8 in the supply reel 2 to travel along the upper fixed guide pin 10a, the lower movable guide pin 10b, the lower movable guide pin 10c and the upper fixed guide pin 10d and also to be supplied to above the applying position to be applied (for example, 9a), out of the applying positions 9a to 9c, but below the applying head 4. If the motor 12 is further driven after the ACF sheet 8a is applied to the applying position 9a by the applying head 4 and the base material layer 8b is stripped from the ACF sheet 8a by the moving member 67, this causes the base material layer 8b stripped from the ACF sheet 8a to travel along the lower movable guide pin 10c and the upper fixed guide pin 10d and to be wound by the winding-up reel 11. The control device 200 controls the operation for driving the motor 12, on the basis of the data stored in the data base 300.

Further, in the bonding-sheet applying apparatus according to the present embodiment, the supply reel 2, the cutting device 3, the guide pins 10a to 10d, the winding-up reel 11 and the motor 12 constitute the bonding-sheet supplying device.

As illustrated in FIG. 1, the transfer device 6, which is placed above the applying stage 1, includes a guide rail 71 and an applying-unit transferring driving source 72 such as a motor, and the transfer device 6 is capable of transferring the frame 5 forwardly and rearwardly in the direction X of application. As illustrated in FIG. 1, the guide rail 71 is placed above the applying stage 1 (more specifically, obliquely above the applying stage 1) in parallel to the direction X of application and slidably holds the upper end portion of the frame 5, as illustrated in FIG. 2. Although not illustrated, a threaded shaft is mounted to the guide rail 71 along its overall length in the longitudinal direction (the direction X of application) such that it is rotatable about a longitudinal axis. A nut is threadably engaged with the threaded shaft such that the rotation thereof is prevented. The frame 5 is fixedly coupled to the nut. Accordingly, if the threaded shaft is rotated in the normal and reverse directions by being driven by the driving source 72, then the nut is transferred forwardly and rearwardly in the direction X of application, which causes the frame 5 coupled to the nut, and therefore the applying unit 100, to move forwardly and rearwardly in the direction X of application along the guide rail 71. The control device 200 controls the operations of the driving source 72 for driving in the normal and reverse directions, on the basis of the data stored in the data base 300.

Figure 5:
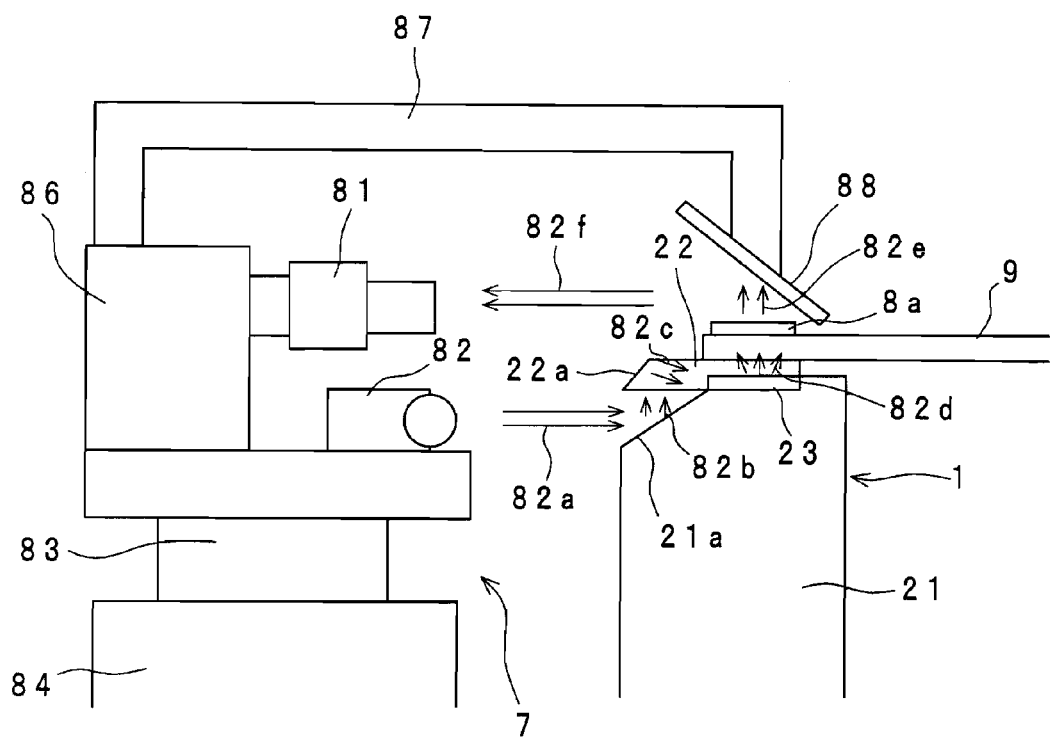
FIG. 5 is an explanation view of the irradiation path for the light from a light source according to the present embodiment.

The inspection device 7 is placed in front of the applying stage 1 in FIG. 1 such that it can be moved forwardly and rearwardly in parallel to the applying stage 1 and includes a camera 81, a light source 82, a movable member 83, a guide rail 84, a movable-member transferring driving source 85 such as a motor, which is an exemplary inspection-device transfer device, an image processing unit 86, an arm 87 and a mirror 88, as illustrated in FIG. 1 and FIG. 5. As illustrated in FIG. 1, the guide rail 84 is placed in parallel to the direction X of application of the ACF sheet 8a and slidably holds the movable member 83. Although not illustrated, a threaded shaft is mounted to the guide rail 84 along its overall length in the longitudinal direction (the direction X of application) such that it is rotatable about a longitudinal axis. A nut is threadably engaged with the threaded shaft such that the rotation thereof is prevented. The movable member 83 is fixedly connected to the nut. Further, the light source 82 and the image processing unit 86 are fixed to the upper surface of the movable member 83. The camera 81 is connected to the image processing unit 86 at its side faced to the applying stage 1. The arm 87 which extends to above the applying stage 1 is fixed to the upper surface of the image processing unit 86. The mirror 88 is mounted to the tip end portion of the arm 87 such that its angle can be adjusted. Accordingly, if the threaded shaft is rotated in the normal and reverse directions by being driven by the driving source 85, this causes the camera 81, the light source 82, the image processing unit 86, the arm 87 and the mirror 88 which are on the movable member 83 to be transferred forwardly and rearwardly in the direction X of application, along the guide rail 84, together with the movable member 83. The control device 200 controls the operations of the driving source 85 for driving in the normal and reverse directions, on the basis of the data stored in the data base 300.

The camera 81 has a field-of-view size capable of photographing the opposite end portions of the LCD board 9 supported on the applying stage 1 for photographing the positioning marks 91 and 92 provided at the opposite end portions (see FIGS. 9A to 9I) and also capable of photographing one end portion of the ACF sheet 8a. The image processing unit 86 recognizes the position of the LCD board 9 supported on the applying stage 1, from the images of the positioning marks 91 and 92 captured by the camera 81, and creates information about the displacement thereof from a proper supporting position. If the image processing unit 86 can not photograph the positioning mark 91 and/or the positioning mark 92, then the image processing unit 86 determines that the LCD board 9 is not properly placed and, then, for example, it stops the entire operation and provides error display on a display portion (not illustrated) which is additionally provided in the bonding-sheet applying apparatus according to the present embodiment. Further, the image processing unit 86 determines whether the applied state is favorable or unfavorable, from the images of the end portions of the ACF sheet 8a captured by the camera 81.

Further, in the present embodiment, in order to facilitate photographing the end portions of the ACF sheet 8a with the camera 81, the inspection device 7 is provided with an optical system having the light source 82 and having the following structure.

The light source 82 is installed to direct the light therefrom to the upper end portion of the applying stage 1.

The applying stage 1 is constituted by a block 21, a glass member 22 as an exemplary light transparent member and a light diffusion member 23, as illustrated in FIG. 5. The block 21 is provided, at its upper portion, with an inclined portion 21a which is inclined by, for example, 45 degree, at its side which is faced to the camera 81, in order to reflect the light emitted from the light source 82 upwardly. The light diffusion member 23 is mounted to the upper end surface of the block 21 which is continuous with the inclined portion 21a. The light diffusion member 23 is made of a ceramic and the like, has fine concavity and convexity on its surface, and therefore is capable of diffusing light with the concavity and convexity. The width of the light diffusion member 23 in the direction orthogonal to the direction X of application is set to be greater than the width of the ACF sheet 8a, in order to diffuse light over the entire ACF sheet 8a.

The glass member 22 is placed to cover the entire upper surface of the light diffusion member 23 and to protrude laterally toward the guide rail 84 such that the protruding portion is positioned above the inclined portion 21a of the block 21. The glass member 22 is provided, at its protruding portion, with an inclined portion 22a which is inclined by, for example, 45 degree, similar to the inclined portion 21a of the block 21, at its side which is faced to the guide rail 84. The inclined portion 21a of the block 21 and the inclined portion 22a of the glass member 22 are provided with a light reflection film or a light reflection layer, such as a metal film. Further, it is preferable that the glass member 22 is made of the same or similar material as or to that of the LCD board 9. By forming it as described above, it is possible to reduce the unevenness of the heat quantity transferred to the LCD board 9.

In FIG. 5, arrows 82a to 82f designate the path of light from the light source 82 which is directed to the upper end portion of the applying stage 1. The light 82a of the light source 82 directed to the applying stage 1 is reflected upwardly by the inclined portion 21a of the block 21, at first. Then, the light 82b reflected by the inclined portion 21a enters the inside of the glass member 22 from its lower surface upwardly and, then, is reflected by the inclined portion 22a of the glass member 22 in the lateral direction, namely in such a direction that it gets away from the light source 82. Then, the light 82c which has been reflected by the inclined portion 22a in such a direction that it gets away from the light source 82 enters the inside of the light diffusion member 23 and, then, is diffused within the glass member 22 by the light diffusion member 23. Then, the light (diffused light) 82d diffused upwardly, out of the light (diffused light) diffused by the light diffusion member 23, exits the glass member 22 and then passes through the LCD board 9, thus causing a silhouette of the ACF sheet 8a to emerge. Then, the light 82e passed through the LCD board 9 and the ACF sheet 8a is reflected by the mirror 88. Then, the light 82f reflected by the mirror 88 enters the camera 81.

The inspection device 7 photographs, with the camera 81, the silhouette which has emerged through the light from the light source 82 as described above by reflecting it by the mirror 88, and inspects, with the image processing unit 86, the images captured by the camera 81 to check the applied state of the ACF sheet 8a. In other words, the inspection device 7 directs the light (diffused light) 82d diffused upwardly out of the light (diffused light) diffused by the light diffusion member 23 to the ACF sheet 8a below, then photographs, with the camera 81, the state of the interception of the diffused light 82d by the ACF sheet 8a, and inspects it with the image processing unit 86 to check the applied state of the ACF sheet 8a.

Figure 6A:
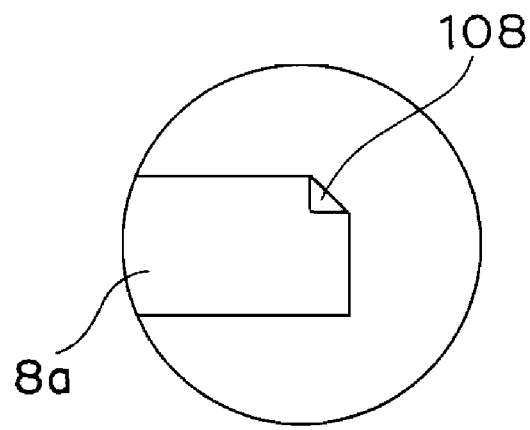
FIG. 6A is a view illustrating an exemplary image of one end portion of an ACF sheet captured by a camera in the bonding-sheet applying apparatus according to the present embodiment.
Figure 6B:
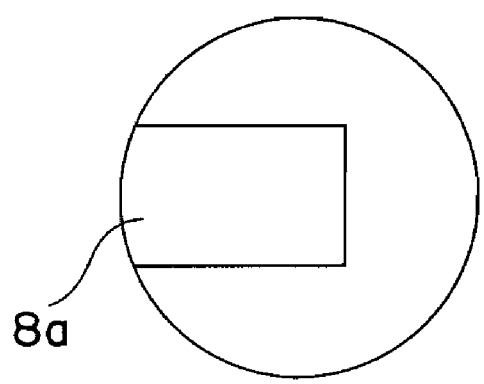
FIG. 6B is a view illustrating another exemplary image of one end portion of an ACF sheet captured by the camera in the bonding-sheet applying apparatus according to the present embodiment.

As a method for determining whether the applied state of the ACF sheet 8a is favorable or unfavorable, for example, the image processing unit 86 pre-stores an image of an ACF sheet 8a which has been accurately applied as a reference image and makes a comparison between an image actually captured by the camera 81 and the reference image and, if the matching ratio therebetween is 95% or more, the image processing unit 86 makes a determination of "favorable applied state", but if the matching ratio is less than 95%, the image processing unit 86 makes a determination of "unfavorable application". For example, if the image of an end portion of the ACF sheet 8*a* captured actually by the camera 81 shows curling (a portion which is not applied) 108 as illustrated in FIG. 6A, and therefore the matching ratio is 90%, then the image processing unit 86 makes a determination of "unfavorable application". If the image processing unit 86 makes a determination of "unfavorable application", for example, then the frame-transferring driving source 72 is driven in the reverse direction to transfer the applying unit 100 again to above the ACF sheet 8*a* which has been given the determination of "unfavorable application", and the ACF sheet 8*a* is heated, pressed and cooled again by the applying head 4. As a result, a new ACF sheet 8*a* is applied onto the ACF sheet 8*a* which has been given the determination of "unfavorable application". On the other hand, if the ACF sheet 8*a* has no curling and the like, and therefore the matching ratio is about 100%, as illustrated in FIG. 6B, the image processing unit 86 makes a determination of "favorable applied state". If the image processing unit 86 makes a determination of "favorable applied state", the applying operation by the applying unit 100 is continued.

The bonding-sheet applying apparatus according to the present embodiment has the aforementioned structure.

Further, while, in the bonding-sheet applying apparatus according to the present embodiment, the camera 81 is placed to photograph the silhouette of the ACF sheet 8*a* (namely, the state of the interception of the diffused light 82*d* by the ACF sheet 8*a*) after it is reflected by the mirror 88, the camera 81 can also be placed to photograph it directly from thereabove without using the mirror 88, as a matter of cause. In this case, the camera 81 can be mounted to the frame 5.

Further, while, in the bonding-sheet applying apparatus according to the present embodiment, the cutting device 3 is used to form cutouts in the ACF sheet 8*a*, cutouts can be formed in advance.

Moreover, in the bonding-sheet applying apparatus according to the present embodiment, the single camera 81 is used for recognizing the positioning marks 91 and 92 and for photographing the ACF sheet 8*a*. However, in cases where there is a large difference between the field-of-view sizes necessary for recognizing the positioning marks 91 and 92 and for photographing the ACF sheet 8*a*, it is possible to provide respective dedicated cameras therefor.

Figure 8:
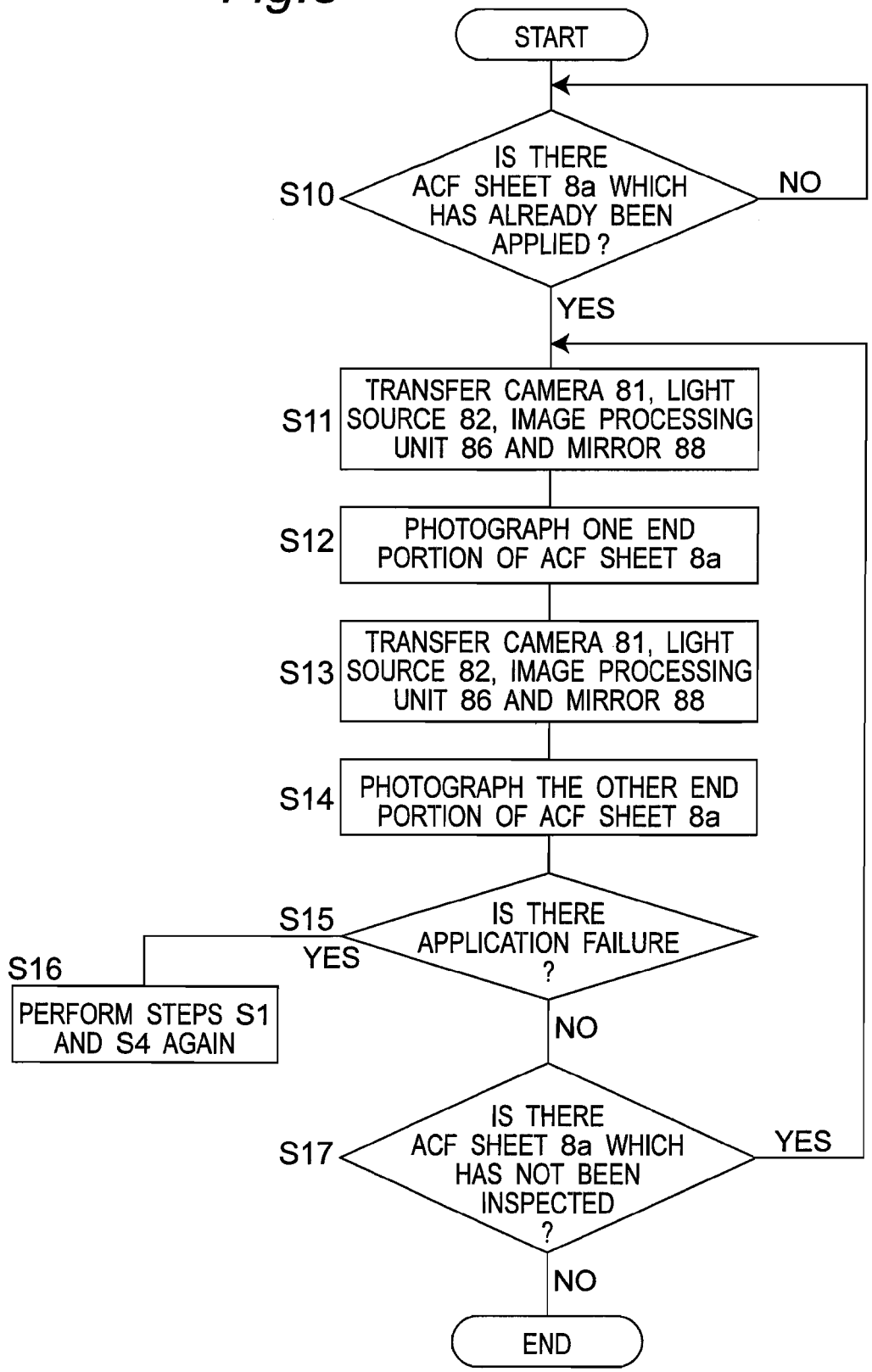
FIG. 8 is a flow chart of inspection step by the bonding-sheet applying apparatus according to the present embodiment.

Next, a bonding-sheet applying method according to the present embodiment will be described, with reference to FIG. 1, FIG. 2, FIGS. 6 to 8 and FIGS. 9A to 9I. The bonding-sheet applying method according to the present embodiment includes the steps of applying the ACF sheet 8*a* to the applying positions 9*a* to 9*c* along the single side of the LCD board 9 and inspecting the applied state of the ACF sheet 8*a* at the respective applying positions 9*a* to 9*c* in order. FIG. 7 is a flow chart of the step of applying the ACF sheet 8*a*, and FIG. 8 is a flow chart of the inspection step. FIGS. 9A to 9I are schematic views for describing the step of inspecting the ACF sheet 8*a*. First, the applying step will be described in detail.

First, the LCD board 9 is supported at a single side thereof on a predetermined position on the applying stage 1.

Subsequently, the control device 200 drives the driving source 85 for the inspection device 7 to move the movable member 83 for transferring the camera 81, the light source 82, the image processing unit 86, the arm 87 and the mirror 88 on the movable member 83 in the direction X of application, along the guide rail 84. After transferring the movable member 83 supporting, thereon, the camera 81, the light source 82, the image processing unit 86, the arm 87 and the mirror 88 and the like to near one end portion of the LCD board 9 (a side of the positioning mark 92), the control device 200 stops driving the driving source 85.

Then, the control device 200 directs the light of the light source 82 to the upper end portion of the applying stage 1 and causes the camera 81 to photograph the emerging silhouette of the positioning mark 92 by reflecting it by the mirror 88 (FIG. 9A).

Subsequently, the control device 200 drives the driving source 85 for the inspection device 7 in the reverse direction to transfer the movable member 83 and the camera 81 thereon, in the direction opposite from the direction X of application, along the guide rail 84. After transferring the movable member 83 including the camera 81 and the like to the other end portion of the LCD board 9 (a side of the positioning mark 91), the control device 200 stops driving the driving source 85.

Then, the control device 200 directs the light of the light source 82 to the upper end portion of the applying stage 1 and causes the camera 81 to photograph the emerging silhouette of the positioning mark 91 by reflecting it by the mirror 88 (FIG. 9B).

Then, the image processing unit 86 recognizes the position of the LCD board 9, on the basis of the captured images of the silhouettes of the positioning marks 91 and 92. At this time, if the image processing unit 86 recognizes the positioning mark 91 and/or the positioning mark 92 and, on the basis of the result of the recognition, the error of the positioning of the LCD board 9 falls within a permissible range, the control device 200 starts the applying operation and the inspection operation, as will be described hereinafter.

First, the control device 200 drives the driving source 72 for the transfer device 6 to transfer the applying unit 100 along the guide rail 71, such that the applying head 4 is positioned above the first applying position 9*a* on the LCD board 9 (FIG. 7: step S1).

Subsequently, the control device 200 drives the motor 12 for rotating the winding-up reel 11 to cause the winding-up reel 11 to wind up only the base material layer 8*b* of the ACF sheet continuous member 8 by guiding it through the upper fixed guide pin 10*d* and the lower movable guide pin 10*c*, while drawing out the ACF sheet continuous member 8 from the supply reel 2 by guiding through the upper fixed guide pin 10*a* and the lower movable guide pin 10*b*. Then, the control device 200 causes the ACF sheet continuous member 8 to travel along the upper fixed guide pin 10*a* and the lower movable guide pin 10*b* and supplies the ACF sheet continuous member 8 to above the first applying position 9*a*, such that the ACF sheet 8*a* is faced to the LCD board 9 below the applying head 4 (FIG. 7: step S2). At this time, the ACF sheet continuous member 8 is supplied thereto such that the tip end portion of the ACF sheet 8*a* is coincident with the tip end portion of the first applying position 9*a* on the LCD board 9 which is closer to the second applying position 9*b*.

Then, the control device 200 drives the first air cylinder (not illustrated) to expand the upper arm 3*b* and the lower arm 3*c* of the cutting device 3 in the lateral direction, so that the upper arm 3*b* and the lower arm 3*c* sandwich the ACF sheet continuous member 8 therebetween.

Then, the control device 200 drives the second air cylinder (not illustrated) to move the blade 3*d* in the lower arm 3*c* upwardly for cutting only the ACF sheet 8*a* of the ACF sheet continuous member 8 into a length equal to the length of the first applying position 9*a* for forming a cutout, without cutting the base material layer 8*b*. Thus, an ACF sheet 8*a* with a predetermined size is made extractable from the ACF sheet continuous member 8 and is positioned between the bottom surface of the applying head 4 and the first applying position 9*a* on the LCD board 9 (FIG. 7: step S3).

Then, the control device 200 drives, in the normal direction, the motor 37 for moving the applying head 4 and the lower guide pins 10b and 10c upwardly and downwardly to descend the applying head 4 and also to descend the lower movable guide pins 10b and 10c. At this time, the bottom surface of the applying head 4 has been heated in advance by the heater (not illustrated).

The lower movable pins 10b and 10c descend and the retaining block 54 holding the lower movable pins 10b and 10c reaches the lower end position, and then only the applying head 4 descends together with the protrusion 31 and the rod 32 with respect to the lower movable guide pins 10b and 10c while contracting the coil spring 33. Consequently, the ACF sheet continuous member 8 extended on the bottom surface of the applying head 4 between the lower movable guide pins 10b and 10c is pressed and contacted to the first applying position 9a on the LCD board 9. At this time, the ACF sheet 8a is heated by the bottom surface of the applying head 4 which has been heated by the heater, with the base material layer 8b interposed therebetween.

Then, after the elapse of a preset time period (for example, 2 seconds), the control device 200 stops heating by the heater and cools the ACF sheet 8a by the cooling device (not illustrated) (FIG. 7: step S4). As a result, the ACF sheet 8a is bonded to the first applying position 9a on the LCD board 9, but at this state the base material layer 8b is still adhered to the ACF sheet 8a.

Then, the control device 200 drives the motor 37 in the reverse direction to move the applying head 4 upwardly. Along with the upward movement of the applying head 4, the coil spring 33 expands to the original length, and thereafter the lower movable guide pins 10b and 10c ascend integrally with the applying head 4. At this time, the base material layer 8b tries to ascend together with the lower movable guide pins 10b and 10c due to the elasticity and the tension of itself, which causes the opposite end portions of the base material layer 8b to be partially stripped from the ACF sheet 8a bonded to the first applying position 9a of the LCD board 9.

Subsequently, the control device 200 drives, in the normal direction, the motor 65 for rotating the timing belt 63 in the normal and reverse directions to move forwardly the moving member 67 upstream in the direction X of application, from the standby position which is below the lower end portion of the frame 5 and is downstream of the lower movable guide pin 10b in the direction X of application. Accordingly, the moving member 67 intrudes between the end portion of the ACF sheet 8a and the end portion of the base material layer 8b which have been partially stripped, so that the moving member 67 forcibly stripes the base material layer 8b from the ACF sheet 8a. The control device 200 further moves the moving member 67 forwardly in the direction X of application to strip the base material layer 8b completely from the ACF sheet 8a, and thereafter drives the motor 65 in the reverse direction to move rearwardly the moving member 67 downstream in the direction X of application to restore it to the original standby position (FIG. 7: step S5).

Thus, the operation for applying the ACF sheet 8a to the first applying position 9a on the LCD board 9 has been completed. After completing the operation for applying the ACF sheet 8a to the first applying position 9a on the LCD board 9, the control device 200 stores, in the data base 300, the fact that the applying operation for the first applying position 9a has been completed.

Subsequently, the control device 200 determines, from the data stored in the data base 300, whether or not there is an applying position on the LCD board 9 to be subsequently applied. If there is an applying position, the control device 200 repeats the steps S1 to S5. If there is no applying position, the applying operation is ended. Namely, in the present embodiment, the steps S1 to S5 are repeated, until the ACF sheet 8a has been applied to the second and third applying positions 9b and 9c along the single side of the LCD board 9 (FIG. 7: step S6). Further, in the present embodiment, the operations at the steps S1 to S5 are simply referred to as "applying operations".

Next, the inspection step will be described in detail.

First, the control device 200 determines, from the data stored in the data base 300, whether or not there is an ACF sheet 8a which has already been applied to an applying position on the LCD board 9. If there is no ACF sheet 8a, the control device 200 completes the operation for applying the ACF sheet 8a to applying positions on the LCD board 9 and stands by until the fact that there is an ACF sheet 8a applied to an applying position is stored (FIG. 8: step S10).

Then, if there is an ACF sheet 8a which has already been applied to an applying position on the LCD board 9, the control device 200 drives the driving source 85 for the inspection device 7, in order to capture images of the applied ACF sheet 8a.

More specifically, for example, after the step S5 of applying the ACF sheet 8a to the first applying position 9a on the LCD board 9 (FIG. 9C), the control device 200 drives the driving source 72 for the transfer device 6 to transfer the applying unit 100 to the second applying position 9b on the LCD board 9 (FIG. 7: step S1). At the same time, the control device 200 drives the driving source 85 for the inspection device 7 to transfer the movable member 83 and the camera 81, the light source 82, the image processing unit 86, the arm 87 and the mirror 88 on the movable member 83 to near the end portion of the first applying position on the LCD board 9 which is farther from the second applying position 9b, along the guide rail 84 (FIG. 8 step S11), since the ACF sheet 8a has already been applied to the first applying position 9a on the LCD board 9 (FIG. 8: step S11).

The control device 200 directs the light of the light source 82 to the upper end portion of the applying stage 1 and causes the camera 81 to photograph the emerging silhouette of the end portion of the ACF sheet 8a at the first applying position 9a on the LCD board 9 which is farther from the second applying position 9b, by reflecting it by the mirror 88 (FIG. 8: step S12, FIG. 9D). FIG. 1 illustrates this state.

Subsequently, the control device 200 drives the movable-member transferring driving source 85 to transfer the movable member 83 and the camera 81, the light source 82, the image processing unit 86, the arm 87 and the mirror 88 on the movable member 83 to near the end portion of the first applying position 9a on the LCD board 9 which is closer to the second applying position 9b, along the guide rail 84 (FIG. 8: step S13).

Then, the control device 200 directs the light of the light source 82 to the upper end portion of the applying stage 1 to cause a silhouette of the end portion of the ACF sheet 8a at the first applying position 9a on the LCD board 9 which is closer to the second applying position 9b to emerge through the directed light, and further, causes the camera 81 to photograph the silhouette by reflecting it by the mirror 88 (FIG. 8: step S14, FIG. 9E).

Then, on the basis of the captured images of the opposite end portions of the ACF sheet 8a, the image processing unit 86 determines whether the applied state of the ACF sheet 8a which has been photographed is favorable or unfavorable (FIG. 8: step S15).

If the image processing unit 86 makes a determination of "unfavorable application" for the ACF sheet 8a at the first applying position 9a, for example, the control device 200 stops the current applying operation such as the operation for applying the ACF sheet 8a to the second applying position 9b (steps S1 to S5) or completes this bonding operation in cases where the bonding operation is about to be completed. During this time, the control device 200 temporarily stops the inspection operation by the inspection device 7.

Subsequently, the control device 200 drives the driving source 72 for the transfer device 6 in the reverse direction to transfer the applying head 4 to above the first applying position 9a on the LCD board 9, again, and cools the ACF sheet 8a after heating and pressing it again (FIG. 8: step S16). At the same time, the control device 200 drives the driving source 85 for the inspection device 7 in the reverse direction to retract the movable member 83 and the camera 81, the light source 82, the image processing unit 86, the arm 87 and the mirror 88 on the movable member 83, in the direction opposite from the direction X of application, along the guide rail 84, so as to prevent the arm 87 and the mirror 88 in the inspection device 7 from colliding against the applying unit 100.

Then, after the operations for heating, pressing and cooling the ACF sheet 8a at the first applying position 9a again, the control device 200 drives the driving source 85 for the inspection device 7 to transfer the movable member 83 and the camera 81, the light source 82, the image processing unit 86, the arm 87 and the mirror 88 on the movable member 83 to near the end portion of the first applying position 9a on the LCD board 9 which is farther from the second applying position 9b, along the guide rail 84 (step S11). At this time, the control device 200 drives the driving source 72 for the transfer device 6 to transfer the applying unit 100 in the direction X of application for retracting it, in order to prevent the arm 87 and the mirror 88 in the inspection device from colliding against the applying unit 100. Hereinafter, the steps S12 to S15 are conducted, again.

If the image processing unit 86 makes a determination of "favorable applied state" for the ACF sheet 8a at the first applying position 9a, then the control device 200 completes the current applying operation, namely the operation for applying the ACF sheet 8a to the second applying position 9b (steps S1 to S5). After completing the operation for applying the ACF sheet 8a to the second applying position 9b on the LCD board 9, the control device 200 stores, in the data base 300, the fact that the applying operation for the second applying position 9b has been completed and the fact that the inspection operation for the first applying position 9a has been completed.

Then, the control device 200 drives the driving source 72 for the transfer device 6 to transfer the applying unit 100 to the third applying position on the LCD board 9 (FIG. 7: step S1). At the same time, the control device 200 drives the driving source 85 for the inspection device 7 to transfer the camera 81, the light source 82, the image processing unit 86, the arm 87 and the mirror 88 on the movable member 83 to near the end portion of the second applying position 9b on the LCD board 9 which is farther from the third applying position 9c, along the guide rail 84 (FIG. 8: step S11), since the data stored in the data base 300 includes the data of the ACF sheet 8a which has already been applied to the second applying position 9b on the LCD board 9 but has not been inspected (FIG. 8: step S17).

Then, the control device 200 directs the light of the light source 82 to the upper end portion of the applying stage 1 and causes the camera 81 to photograph the emerging silhouette of the end portion of the ACF sheet 8a at the second applying position 9b on the LCD board 9 which is farther from the third applying position 9c, by reflecting it by the mirror 88 (FIG. 8: step S12, FIG. 9F).

Then, the control device 200 drives the driving source 85 for the inspection device 7 to transfer the camera 81, the light source 82, the image processing unit 86, the arm 87 and the mirror 88 on the movable member 83 to near the end portion of the second applying position 9b on the LCD board 9 which is closer to the third applying position 9c, along the guide rail 84 (FIG. 8: step S13).

Figure 9G:
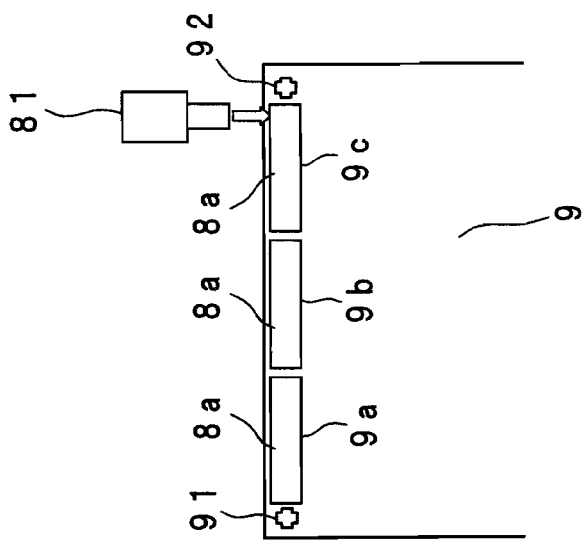
FIG. 9G is an explanation view of the inspection step by the bonding-sheet applying apparatus according to the present embodiment.

Subsequently, the control device 200 directs the light of the light source 82 to the upper end portion of the applying stage 1 and causes the camera 81 to photograph the emerging silhouette of the end portion of the ACF sheet 8a at the second applying position 9b on the LCD board 9 which is closer to the third applying position 9c, by reflecting it by the mirror 88 (FIG. 8: step S14, FIG. 9G).

Then, on the basis of the captured images of the opposite end portions of the ACF sheet 8a, the image processing unit 86 determines whether the applied state is favorable or unfavorable (FIG. 8: step S15).

If the image processing unit 86 makes a determination of "unfavorable application" for the ACF sheet 8a at the second applying position 9a, for example, the control device 200 completes the current applying operation such as the operation for applying the ACF sheet 8a to the third applying position 9c (steps S1 to S5). During this time, the control device 200 temporarily stops the inspection operation by the inspection device 7.

Subsequently, the control device 200 drives the driving source 72 for the transfer device 6 in the reverse direction to transfer the applying head 4 to above the second applying position 9b on the LCD board 9, again, and cools the ACF sheet 8a after heating and pressing it again (FIG. 8: step S16). At the same time, the control device 200 drives the driving source 85 for the inspection device 7 in the reverse direction to retract the movable member 83 and the camera 81, the light source 82, the image processing unit 86, the arm 87 and the mirror 88 on the movable member 83 in the direction opposite from the direction X of application, along the guide rail 84, on order to prevent the arm 87 and the mirror 88 in the inspection device from colliding against the applying unit 100.

Then, after completing the operation for heating, pressing and cooling the ACF sheet 8a at the second applying position 9b again, the control device 200 drives the driving source 85 for the inspection device 7 to transfer the movable member 83 and the camera 81, the light source 82, the image processing unit 86, the arm 87 and the mirror 88 on the movable member 83 to near the end portion of the second applying position 9b on the LCD board 9 which is farther from the third applying position 9c, along the guide rail 84 (step S11). At this time, the control device 200 drives the driving source 72 for the transfer device 6 to transfer the applying unit 100 in the direction X of application for retracting it, in order to prevent the arm 87 and the mirror 88 in the inspection device from colliding against the applying unit 100. Hereinafter, the steps S12 to S15 are conducted, again.

If the image processing unit 86 makes a determination of "favorable applied state" for the ACF sheet 8a at the second applying position 9b, the control device 200 completes the current applying operation, namely the operation for applying the ACF sheet 8a to the third applying position 9c (steps S1 to S5). After completing the operation for applying the ACF sheet 8a to the third applying position 9c, the control device 200 stores, in the data base 300, the fact that the applying operation for the third applying position 9c has been completed and the fact that the inspection operation for the second applying position 9b has been completed.

Then, the control device 200 drives the driving source 72 for the transfer device 6 to transfer the applying unit 100 in the direction X of application for retracting it from the third applying position 9c on the LCD board 9. At the same time, the control device 200 drives the driving source 85 for the inspection device 7 to transfer the camera 81, the light source 82, the image processing unit 86, the arm 87 and the mirror 88 on the movable member 83 to near the end portion of the third applying position 9c on the LCD board 9 which is closer to the second applying position 9b, along the guide rail 84 (FIG. 8: step S11), since the data stored in the data base 300 includes the data of the ACF sheet 8a which has already been applied to the third applying position 9c on the LCD board 9 but has not been inspected (FIG. 8: step S17).

Figure 9H:
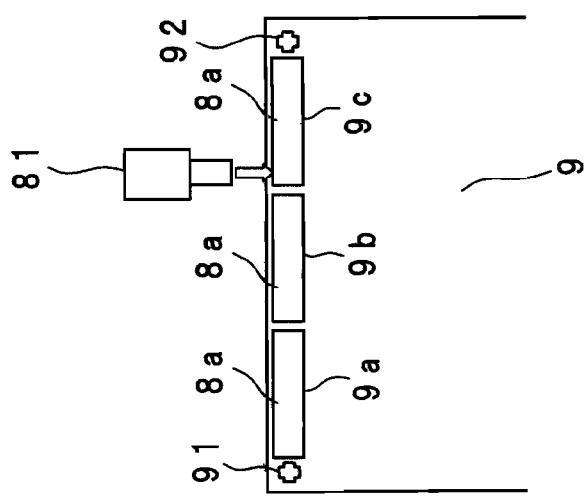
FIG. 9H is an explanation view of the inspection step by the bonding-sheet applying apparatus according to the present embodiment.

Subsequently, the control device 200 directs the light of the light source 82 to the upper end portion of the applying stage 1 and causes the camera 81 to photograph the emerging silhouette of the end portion of the ACF sheet 8a at the third applying position 9c on the LCD board 9, by reflecting it by the mirror 88 (FIG. 8: step S12, FIG. 9H).

Then, the control device 200 drives the driving source 85 for the inspection device 7 to transfer the camera 81, the light source 82, the image processing unit 86, the arm 87 and the mirror 88 on the movable member 83 to near the end portion of the third applying position 9c on the LCD board 9 which is farther from the second applying position 9b, along the guide rail 84 (FIG. 8: step S13).

Figure 9I:
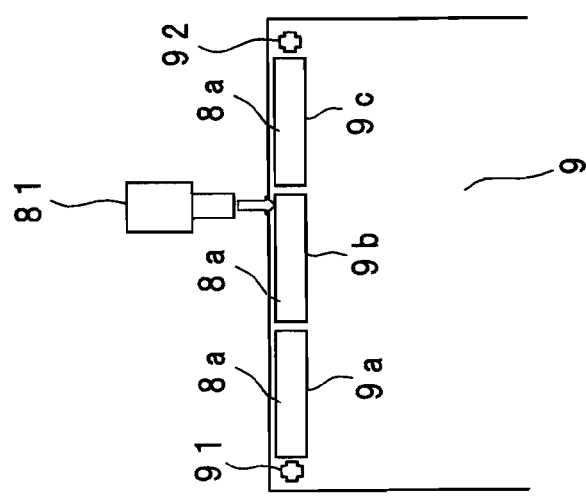
FIG. 9I is an explanation view of the inspection step by the bonding-sheet applying apparatus according to the present embodiment.

Then, the control device 200 directs the light source 82 to the upper end portion of the applying stage 1 and causes the camera 81 to photograph the emerging silhouette of the end portion of the ACF sheet 8a at the third applying position 9c on the LCD board 9 which is farther from the second applying position 9b, by reflecting it by the mirror 88 (FIG. 8: step S14, FIG. 9I).

Then, on the basis of the captured images of the opposite end portions of the ACF sheet 8a, the image processing unit 86 determines whether the applied state is favorable or unfavorable (FIG. 8: step S15).

If the image processing unit 86 makes a determination of "unfavorable application" for the ACF sheet 8a at the third applying position 9c, for example, the control device 200 completes the current applying operation such as the operation for applying the ACF sheet 8a to the third applying position 9c (steps S1 to S5) or completes this bonding operation in cases where the bonding operation is about to be completed. During this time, the control device 200 temporarily stops the inspection operation by the inspection device 7.

Subsequently, the control device 200 drives the driving source 72 for the transfer device 6 in the reverse direction to transfer the applying head 4 to above the third applying position 9c on the LCD board 9, again, and cools the ACF sheet 8a after heating and pressing it again (FIG. 8: step S16). At the same time, the control device 200 drives the driving source 85 for the inspection device 7 in the reverse direction to transfer the movable member 83 and the camera 81, the light source 82, the image processing unit 86, the arm 87 and the mirror 88 on the movable member 83 in the direction opposite from the direction X of application, along the guide rail 84, for retracting them, in order to prevent the arm 87 and the mirror 88 in the inspection device from colliding against the applying unit 100.

Then, after completing the operation for heating, pressing and cooling the ACF sheet 8a at the third applying position 9c again, the control device 200 drives the driving source 85 for the inspection device 7 to transfer the movable member 83 and the camera 81, the light source 82, the image processing unit 86, the arm 87 and the mirror 88 on the movable member 83 to near the end portion of the third applying position 9c on the LCD board 9 which is closer to the second applying position 9b, along the guide rail 84 (step S11). At the same time, the control device 200 drives the driving source 72 for the transfer device 6 to transfer the applying unit 100 in the direction X of application for retracting it, in order to prevent the arm 87 and the mirror 88 in the inspection device from colliding against the applying unit 100. Hereinafter, the steps S12 to S15 are conducted, again.

If the image processing unit 86 makes a determination of "favorable applied state" for the ACF sheet 8a at the third applying position 9c, the control device 200 stores, in the data base 300, the fact that the inspection operation for the third applying position 9c has been completed. The control device 200 ends the inspection process, since the data stored in the data base 300 includes no data of an ACF sheet 8a which has already been applied but has not been inspected (FIG. 8: step S17).

The bonding-sheet applying apparatus according to the present embodiment conducts the aforementioned applying step and inspection step.

Further, while, in the bonding-sheet applying apparatus according to the present embodiment, the respective driving sources for the transfer device 6 and the inspection device 7 are provided separately, it is also possible to provide a single driving source therefore. For example, as illustrated in FIG. 10, the camera 81 of the inspection device 7 can be mounted downstream of the applying head 4 on the frame 5 in the direction X of application such that the interval between the camera 81 and the applying head 4 can be adjusted depending on the length of the ACF sheet 8a, in order to enable the camera 81 to photograph the respective end portions of the ACF sheet 8a. Further, in FIG. 10, the direction X of application is illustrated as being the direction opposite from that in the other figures, for ease of illustration.

Further, in this case, the light source 82 can be also installed downstream of the applying head 4 on the frame 5 in the direction X of application such that the interval between the light source 82 and the applying head 4 can be adjusted, similarly to the camera 81, in order to enable directing light to the applying stage 1 from thereabove. As illustrated in FIG. 10, the light source 82 can be secured at a position parallel to the longitudinal direction (the direction X of application) of the applying stage 1, in order to enable directing light to the entire inclined portion 82b of the applying stage 1. The light source 82 can be adapted to direct its light to only the inclined portion 82b of the applying stage 1 which corresponds to the ACF sheet 8a being inspected.

In addition, the inspection device 7 can be mounted downstream of the applying head 4 on the frame 5 in the direction X of application, and also, the inspection device 7 can include a first camera for inspecting one end portion of an ACF sheet 8a applied to a predetermined applying position on the LCD board 9 and a second camera for inspecting the other end portion thereof and can be adapted to be transferred integrally with the applying unit 100 by the driving source 72 for the transfer device 6. Also, the first and the second cameras can be mounted directly on the frame 5. This structure can simplify or eliminate the mechanism for driving the inspection device 7. Also, in the case of providing the first and second cameras, it is possible to inspect the opposite end portions of the ACF sheet 8a with the first and second cameras concurrently, which enables shortening the inspection step (skipping the step S13 and the step S14).

While, in the bonding-sheet applying method according to the present embodiment, the inspection of the applied state is performed on the ACF sheet 8a which was applied just before the applying unit 100 performs the operation for applying the next ACF sheet 8a, the present invention is not limited thereto. For example, the inspection can be performed on the ACF sheet 8a which has already been applied to the first applying position 9a on the LCD board 9, while the applying unit 100 performs the applying operation for the third applying position 9c on the LCD board 9. Namely, it is necessary only that, during the operation for applying an ACF sheet 8a to an applying position on the LCD board 9 (the steps S1 to S5), the inspection of the applied state is performed on an ACF sheet 8a which has already been applied to another applying position on the LCD board 9 (the steps S10 to S15).

Further, in the bonding-sheet applying apparatus and method according to the present embodiment, if the image processing unit 86 makes a determination of "unfavorable application" for an ACF sheet 8a applied at an applying position on the LCD board 9, then the ACF sheet 8a is heated, pressed and cooled again. However, the present invention is not limited thereto. The operations can be properly changed depending on the situation, for example, in such a way that, if an ACF sheet 8a has large curing 108 (FIG. 6A) which makes it impossible to overcome "the unfavorable application" even by heating, pressing and cooling it again, the applying operation is stopped for enabling manually applying it again.

With the bonding-sheet applying apparatus and method according to the present embodiment, it is possible to perform an inspection of the applied state on an ACF sheet 8a which has already been applied by the applying unit 100 while the applying unit 100 performs the operation for applying an ACF sheet 8a, which can largely reduce the time period from the start of application to the completion of the inspection, in comparison with the conventional art. Furthermore, in the event of the occurrence of an application failure or stripping failure, it is possible to stop the applying operation until the application failure or stripping failure is eliminated, in order to prevent the applying operation for the next applying position from being started. This can reduce the loss of the ACF sheet 8a (to only a single ACF sheet 8a, for example) and also can reduce the loss of the applying operation. This can largely reduce the time period from the start of application of the ACF sheet 8a to a single LCD board 9 to the completion of the inspection, and also, can reduce the possibilities of the loss of the ACF sheet 8a and the loss of the applying operation.

Further, with the bonding-sheet applying apparatus and method according to the present embodiment, the applying stage 1 is provided with the glass member 22 and the light diffusion member 23 such that the light of the light source 82 enters the glass member 22, which enables directing light to the LCD board 9 below without moving the LCD board 9, thereby improving the viewability of the camera. Further, the light diffusion member 23 can suppress the light unevenness, which enables utilization of a light source with smaller illumination such as a blue LED as the light source 82. Furthermore, the light of the light source 82 is entered into the light diffusion member 23 after being reflected by the light reflection members applied to the inclined portions 21a and 22a, which can further suppress the light unevenness, thus improving the inspection accuracy.

While there has been described the present invention with respect to preferable embodiments with a certain degree of concreteness, various changes may be made in details of the structures disclosed in the preferable embodiments, and also, various changes may be made in the combination and the order of respective components without departing from the scope and spirit of the present invention.

It is to be noted that, by properly combining the arbitrary embodiments of the aforementioned various embodiments, the effects possessed by them can be produced.

INDUSTRIAL APPLICABILITY

With the bonding-sheet applying apparatus and method according to the present invention, there are provided the advantages of largely reducing the time period from the start of application of bonding sheets to a single board to the completion of inspections and of reducing the loss of the bonding sheets and the loss of the applying operation. Accordingly, the bonding-sheet applying apparatus and method according to the present invention can be advantageously employed as a bonding-sheet applying apparatus, method and the like for applying, to a board, only a bonding sheet of a bonding-sheet continuous member constituted by the bonding sheet and a base material layer adhered to a single surface of the bonding sheet.

The disclosure of Japanese Patent Application No. 2005-336815 filed on Jan. 22, 2005 including specification, drawing and claims are incorporated herein by reference in its entirety.

The invention claimed is:
1. A bonding-sheet applying apparatus comprising:
an applying stage for supporting a board;
an applying unit for successively applying bonding sheets to applying positions arranged on the board, respectively, the applying unit having a bonding-sheet supplying device for successively supplying the bonding sheets to above the board supported by the applying stage, and an applying head provided above the board so as to be movable up and down, wherein the applying head sequentially presses each of the supplied bonding sheets on a corresponding one of the applying positions arranged on the board;
a transfer device for transferring the applying unit, after the applying unit has applied one of the supplied bonding sheets to one of the applying positions, to a position above another one of the applying positions at which a bonding sheet has not been applied by the applying unit;
an inspection device for inspecting an applied state of the bonding sheet at the one of the applying positions at which the bonding sheet has been applied by the applying unit, while the applying unit successively applies another bonding sheet to another one of the applying positions; and
a light source for emitting light,
wherein the applying stage comprises:
a light transparent member provided to support, from below, the applying positions arranged on the board, and that transmits light from the light source;
a light diffusion member provided below the light transparent member and that diffuses the light from the light source; and
a light reflection member that reflects the light from the light source such that the light is directed to the light diffusion member through the inside of the light transparent member, and
wherein the inspection device inspects the applied state of the bonding sheet at a location where the light from the light source, the light being reflected by the light reflection member, passed through the light transparent member, and diffused by the light diffusion member, is illu- minated on the bonding sheet at the one of the of applying positions at which the bonding sheet has been applied by the applying unit.

2. The bonding-sheet applying apparatus according to claim 1, wherein the transfer device transfers the inspection device and the applying unit integrally.

3. The bonding-sheet applying apparatus according to claim 1, further comprising an inspection-device transfer device for transferring the inspection device independently of the applying unit.

4. A bonding-sheet applying method comprising:
applying a first bonding sheet to a first applying position arranged on a board, the first bonding sheet being applied by an applying unit for applying bonding sheets to the board by descending an applying head, wherein the board is support from below by an applying stage while the applying unit applies the bonding sheets to by the board;
transferring the applying unit, after the applying unit has applied the first bonding sheet to the first applying position, to above a second applying position arranged on the board;
applying a second bonding sheet to the second applying position, the second bonding sheet being applied by the applying unit transferred to above the second applying position; and
inspecting an applied state of the first bonding sheet during a time interval from the start of the transferring of the applying unit to above the second applying position to the completion of the applying the second bonding sheet to the second applying position,
wherein the applying stage comprises:
a light transparent member provided to support, from below, the first and second applying positions arranged on the board, and that transmits light from a light source;
a light diffusion member provided below the light transparent member, and that diffuses the light from the light source; and
a light reflection member that reflects the light from the light source such that the light is directed to the light diffusion member through the inside of the light transparent member, and
wherein the light from the light source, the light being reflected by the light reflection member, passed though the light transparent member, and diffused by the light diffusion member is illuminated to the first bonding sheet, and the inspecting the applied state of the first bonding sheet includes inspecting a state of an interception of the light by the first bonding sheet.

* * * * *